(12) United States Patent
Rayaprolu et al.

(10) Patent No.: US 11,978,514 B2
(45) Date of Patent: *May 7, 2024

(54) ERASE CYCLE HEALING USING A HIGH VOLTAGE PULSE

(71) Applicant: MICRON TECHNOLOGY, INC., Boise, ID (US)

(72) Inventors: Vamsi Pavan Rayaprolu, San Jose, CA (US); Kishore Kumar Muchherla, Fremont, CA (US); Harish R. Singidi, Fremont, CA (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 382 days.

This patent is subject to a terminal disclaimer.

(21) Appl. No.: 17/361,259

(22) Filed: Jun. 28, 2021

(65) Prior Publication Data

US 2021/0327514 A1    Oct. 21, 2021

Related U.S. Application Data

(63) Continuation of application No. 16/528,291, filed on Jul. 31, 2019, now Pat. No. 11,049,566.

(51) Int. Cl.
  *G11C 16/14*    (2006.01)
  *G11C 11/56*    (2006.01)
  *G11C 16/10*    (2006.01)
  *G11C 16/34*    (2006.01)

(52) U.S. Cl.
  CPC .......... *G11C 16/14* (2013.01); *G11C 11/5628* (2013.01); *G11C 11/5635* (2013.01); *G11C 11/5671* (2013.01); *G11C 16/10* (2013.01); *G11C 16/349* (2013.01); *G11C 2211/5644* (2013.01)

(58) Field of Classification Search
  CPC ....... G11C 16/14; G11C 16/10; G11C 16/349; G11C 111/5628; G11C 111/5671
  USPC .................................................... 365/185.11
  See application file for complete search history.

(56) References Cited

U.S. PATENT DOCUMENTS

| | | | | |
|---|---|---|---|---|
| 11,049,566 | B2* | 6/2021 | Rayaprolu | G11C 11/5635 |
| 11,461,035 | B2* | 10/2022 | Venkataraman | G06F 3/0652 |
| 11,709,616 | B2* | 7/2023 | Venkataraman | G06F 3/0625 |
| | | | | 711/154 |
| 2008/0013374 | A1 | 1/2008 | Li et al. | |

(Continued)

OTHER PUBLICATIONS

International Search Report and Written Opinion for Application No. PCT/US2020/044639 dated Nov. 5, 2020, 10 pages.

*Primary Examiner* — Connie C Yoha
(74) *Attorney, Agent, or Firm* — LOWENSTEIN SANDLER LLP

(57) ABSTRACT

An indication to perform a write operation at a memory component can be received. A voltage pulse can be applied to a destination block of the memory component to store data of the write operation, the voltage pulse being at a first voltage level associated with a programmed state. An erase operation for the destination block can be performed to change the voltage state of the memory cell from the programmed state to a second voltage state associated with an erased state. A write operation can be performed to write the data to the destination block upon changing the voltage state of the memory cell to the second voltage state.

20 Claims, 6 Drawing Sheets

(56) References Cited

U.S. PATENT DOCUMENTS

| | | |
|---|---|---|
| 2012/0327720 A1 | 12/2012 | Eguchi |
| 2014/0297924 A1 | 6/2014 | Pangal |
| 2015/0318045 A1 | 11/2015 | Yun |
| 2016/0211032 A1 | 7/2016 | Pang et al. |
| 2016/0260490 A1 | 9/2016 | Lee et al. |
| 2016/0372185 A1 | 12/2016 | Shim et al. |
| 2017/0062059 A1 | 3/2017 | Kim et al. |
| 2018/0158505 A1 | 6/2018 | Lee |
| 2020/0133843 A1* | 4/2020 | Muchherla .......... G06F 12/0246 |
| 2021/0035642 A1* | 2/2021 | Rayaprolu .......... G11C 11/5635 |
| 2023/0268018 A1* | 8/2023 | Rayaprolu .............. G06F 3/065 |

* cited by examiner

ERASE CYCLE HEALING USING A HIGH VOLTAGE PULSE

RELATED APPLICATIONS

This application is a continuation application of U.S. patent application Ser. No. 16/528,291, filed Jul. 31, 2019, which is herein incorporated by reference.

TECHNICAL FIELD

The present disclosure generally relates to a memory sub-system, and more specifically, relates to erase cycle healing using a high voltage pulse for memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
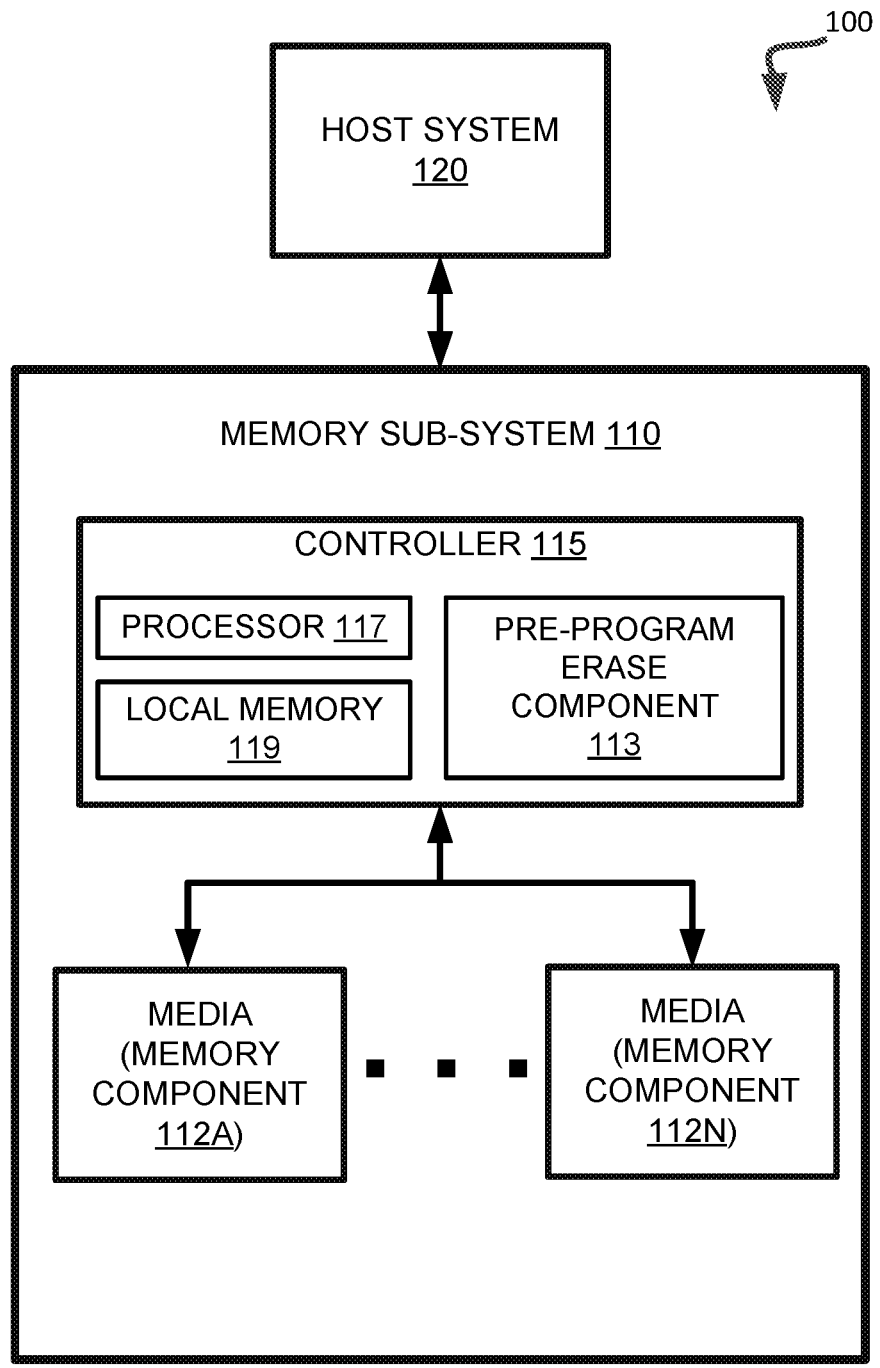
FIG. 1 illustrates an example computing environment that includes a memory sub-system in accordance with some embodiments of the present disclosure.

Aspects of the present disclosure are directed to erase cycle healing based on a high voltage pulse in a memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A memory component can be a memory device, such as a non-volatile memory device. A non-volatile memory device is a package of one or more dice. Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data.

A conventional memory sub-system can include memory components that can be combined with other system components during the manufacturing process. In some instances, a memory component can be affixed to another component so that the components can function together. For example, a memory component can be combined with other electronic components in a cellular phone, a computer, an automobile, an embedded system, etc. The process of affixing the memory component to another component can expose the memory component to a heating process (e.g., soldering) used during assembly to ensure reliable surface mounting. This heating process, typically referred to as InfraRed Reflow (IR Reflow), can expose the memory components to extreme temperatures (200 degrees Celsius to 300 degrees Celsius). In some cases, multiple IR Reflows can be applied to a memory component prior to deploying the resulting memory sub-system.

In conventional memory sub-systems, IR Reflow can negatively impact the reliability of memory components. The extreme temperatures used in the process can cause "electron traps" where electrons can become trapped in areas of the memory component, causing an electronic charge to build within the component. This built up charge can negatively impact reliability as the charge can result in a higher error rate for the memory component during the initial operating life of the memory sub-system. For example, a memory cell of a memory component that should be in a state indicative of an erased state (e.g., a block has been erased and thus prepared to receive new written data), could present a higher error rate due to the built up charges that could impact the representative voltage state of the affected memory cells. Thus, while no data may be written to those memory cells, the voltage states of the memory cells could indicate differently as a result of the built up charges from the IR Reflow. Additionally, some processes during Wafer Manufacturing can cause ION contamination while building up the memory cell. These contaminated IONs when subject to high temperature can disperse through the oxide barrier between the charge storage layer (e.g., the charge trap layer or floating gate layer) and the substrate. As the IONs move closer to the charge storage layer, the data retention properties of the memory cell can be negatively impacted.

Conventional memory sub-systems that are configured in this manner typically address reliability and ION contamination issues by performing repetitive program/erase cycles to write data, erase the data, and write additional data to impacted blocks to force the voltage levels to high voltage states (indicating a programmed state) then back to low voltage states (indicating an erased state). This process can, over time, discharge electron traps and reduce ION contamination, mitigating reliability issues with the memory component. The memory component, however, remains unreliable until a sufficient number of program/erase cycles have been performed on the component. In conventional memory sub-systems, the process of performing an erase operation expends significant resources since an erase is applied to each page of a block. Repetitive program/erase cycles implemented to mitigate electron traps and ION contamination can require significant time and processing resources to improve reliability.

Aspects of the present disclosure address the above and other deficiencies by performing a "pre-program" erase process on a memory component prior to writing new data to the memory component (e.g., prior to placing memory cells of the memory component in a programmed state) during the early operating life of the memory component. The pre-program erase can apply a high voltage pulse to memory cells within a destination block of a memory component to program those cells to their highest voltage state (a programmed state). The pre-program erase can then perform an erase operation on those memory cells to place the memory cells into a low voltage state (an erased state). This process of repeatedly changing the voltage states of memory cells prior to writing new data (e.g., "pre-programming" the memory cells) during the early life of a memory component can eliminate the electron traps as electrons are moved between states, thereby "healing" the affected memory component. Similarly, performing this process to a memory component in a temperature-activated state can cause IONs to move away from the charge storage layer, thereby restoring the data retention capability of the memory component to its original capability prior to any ION contamination. When a request is received to write data to a destination block, the number of erase operations previously performed for the destination block can be compared to a threshold condition. If an insufficient number of erase operations have been performed to move contaminated IONs away from the charge storage layer, the pre-program erase process can be performed on the destination block prior to writing the data.

Advantages of the present disclosure include, but are not limited to, improved reliability of a memory component that has been impacted by IR Reflow during the early operating life of the memory component. Implementing the pre-program erase process of the present disclosure achieves the reliability benefits of moving the contaminated IONs away from the charge storage layer without the increased overhead of conventional methods of performing program/erase cycles. Additionally, since the reliability of the memory component is improved, the performance of a memory sub-system that includes the memory component also improves, since fewer resources are used to perform error correction operations that would result from a memory component that has been impacted by IR Reflow.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a pre-program erase component 113 that can be used to perform erase cycle healing based on a high voltage pulse for blocks stored at the memory components 112A to 112N. In some embodiments, the controller 115 includes at least a portion of the pre-program erase component 113. For example, the controller 115 can include a processor 117 (processing device) configured to execute instructions stored in local memory 119 for performing the operations described herein. In some embodiments, the pre-program erase component 113 is part of the host system 120, an application, or an operating system.

The pre-program erase component 113 can, upon receiving an indication that a write operation is to be performed for memory components 112A to 112N, determine a destination block to store the data of the write operation, and determine a voltage level for a memory cell that indicates that a voltage state of the memory cell is set to a programmed state (e.g., a high voltage state indicative of data being written to that cell). The pre-program erase component 113 can then determine whether the number of erase operations previously performed on the destination block satisfies a threshold condition, and if not, perform the pre-program erase process one or more times. As described in further detail below, the pre-program erase process can include applying a voltage pulse to the destination block using the determined voltage level associated with the programmed state. Subsequently, an erase operation can be performed for the destination block to change the voltage state of the memory cell from the programmed state to a voltage level associated with an erased state. The pre-program erase component 113 can then perform the write operation for the destination block. In various implementations, this process can be repeated for each subsequent write operation directed to that destination block until the total number of erase operations (e.g., the total number of pre-program erase cycles) has satisfied the threshold condition. Further details with regards to the operations of the pre-program erase component 113 are described below.

Figure 2:
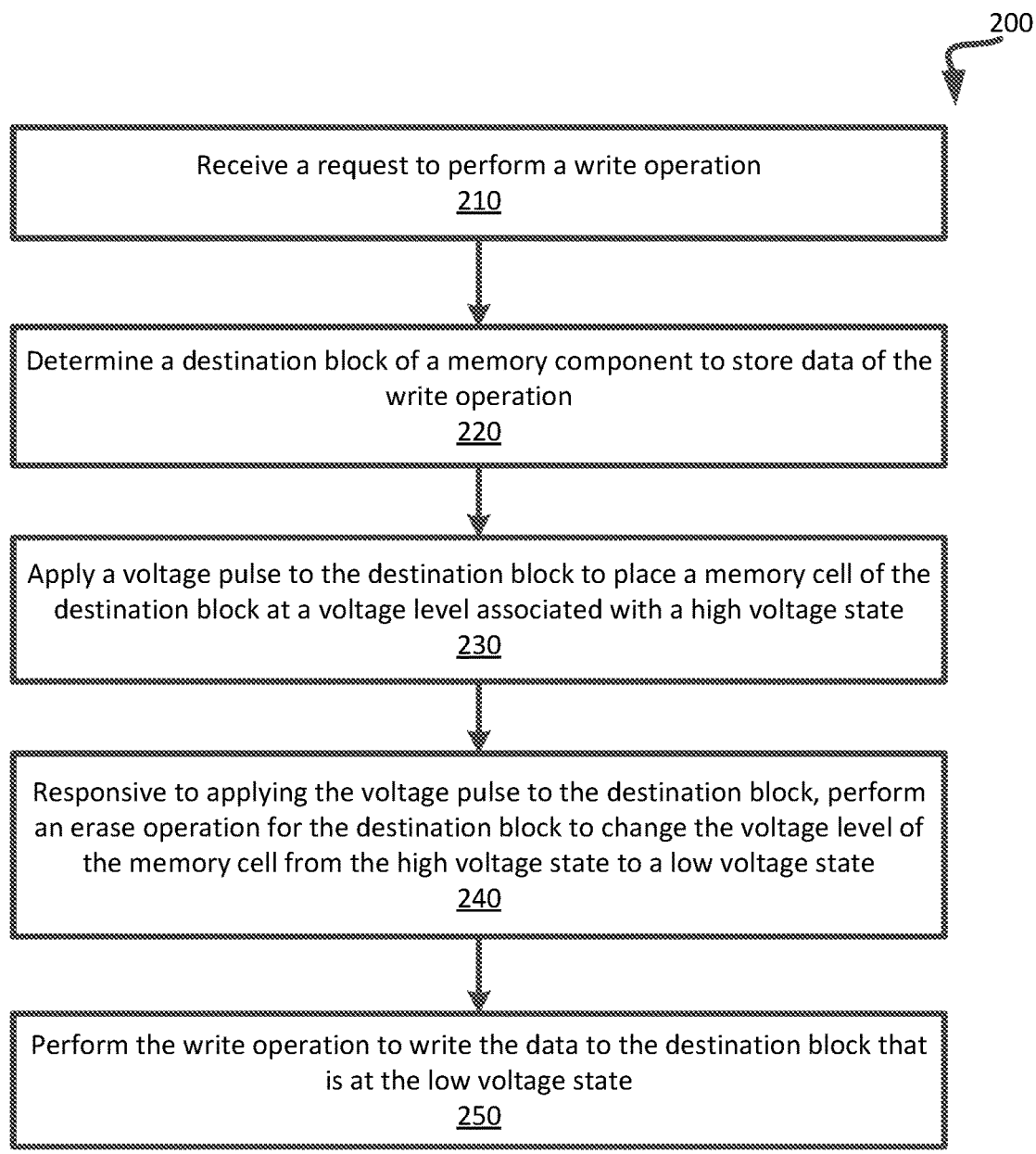
FIG. 2 is a flow diagram of an example method to apply a high voltage pulse to a memory cell prior to an erase operation for a memory sub-system in accordance with some embodiments.

FIG. 2 is a flow diagram of an example method 200 to apply a high voltage pulse to a memory cell prior to an erase operation for a memory sub-system. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the pre-program erase component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic receives a request to perform a write operation. In some embodiments, the request can be received from a host system to write host data to a memory component of a memory sub-system. At operation 220, the processing logic determines a destination block of a memory component to store data of the write operation. In some embodiments, the request received at operation 210 can include an amount of data that is to be written to multiple blocks of the memory component. For example, the data to be written can be divided among multiple destination pages that are located within various blocks of the memory component. The processing logic can determine an available block of the memory component (e.g., a block that is empty and/or otherwise available to receive new data) and divide the data from the request into segments that can be written to one or more pages of the block.

At operation 230, the processing logic applies a voltage pulse to the destination block to place a memory cell of the destination block at a voltage level associated with a high voltage state. In some embodiments, the high voltage state can be associated with a programmed state. In other words, a high voltage state can indicate that the pages of the destination block have been programmed (e.g., data has been written to one or more pages of the block). As such, the amplitude of the voltage pulse can be similar to that which can be used by a write operation of a memory sub-system to set the bits of the memory component to their highest applicable voltage levels.

In various embodiments, programming logic can determine a first voltage level that can be applied to a memory cell of the destination block to set the voltage level of the memory cell to indicate that the memory cell is in the programmed state. Programming logic can then determine a second voltage level that can be applied to the memory cell of the destination block to set the voltage level of the memory cell to indicate that the memory cell is in an erased state. In some implementations, the first voltage level indicative of a programmed state exceeds the second voltage level indicative of the erased state (e.g., the programmed state is at a higher voltage level than the erased state). The voltage level for the voltage pulse can then be set to at least the first voltage level (e.g., the voltage level for the programmed state).

In various embodiments, memory components can include one or more arrays of memory cells such as single-level cell (SLC) memory or multi-level cell (MLC) memory (e.g., triple-level cell (TLC) memory, or quad-level cell (QLC) memory). Each type can have a different data density, which corresponds to an amount of data (e.g., bits of data) that can be stored per memory cell of a memory component. Using the example of a flash based memory, a triple-level cell (TLC) can store four bits of data while a single-level cell (SLC) can store one bit of data. Accordingly, a memory component including TLC memory cells will have a higher data density than a memory component including SLC memory cells. Thus, different types of memory cells can utilize different voltage levels to represent different voltage states.

For example, a single-level cell (SLC) stores a single bit of information in each cell, and therefore each cell can have two possible states—one state representing a value '1' which can be indicative of an erased state and the other state representing a value '0' which can be indicative of a programmed state. In such instances, the voltage level (e.g., the amplitude) for the voltage pulse can be selected such that it is high enough to set all bits of the applicable destination block to value '0' (e.g., the programmed state). Similarly, a multi-level cell (MLC) component can store four bits of data, and therefore each cell can have four possible voltage states. In such a case, the voltage level for the voltage pulse can be selected such that it is high enough to set all bits in the cell to voltage state indicating that the bits of the cell have been programmed. Examples of voltage states for different types of memory cells are illustrated below in conjunction with FIGS. 3A-3B.

The high voltage pulse can be applied to one or more wordlines of the destination block. In some embodiments, the high voltage pulse can be applied to each wordline of the destination block. Alternatively, the high voltage pulse can be applied to a single wordline of the destination block. Similarly, the high voltage pulse can be applied to some number of wordlines that is less than the total number of wordlines of the destination block. As noted above, each memory cell of the one or more wordlines of the destination block to which the high voltage pulse has been applied can thus be in the programmed state in response to the application of the voltage pulse.

At operation 240, responsive to applying the voltage pulse to the destination block, the processing logic performs an erase operation for the destination block to change the voltage level of the memory cell from the high voltage state to a low voltage state. As described above, the low voltage state can be indicative of an erased state for the memory component. In some embodiments, the erase operation can utilize the voltage level that can be applied to the memory cell of the memory component to set the second voltage state of the memory cell that indicates that the memory cell is in an erased state. Consequently, each memory cell of the destination block (e.g., each memory cell of the wordlines in the destination block that have been exposed to the voltage pulse at operation 240) can be in an erased state in response to performing the erase operation.

In some embodiments, operations 230 and 240 can be performed based upon meeting an erase threshold condition. Thus, the high voltage pulse and erase operations can be performed on the destination block based on a number of erase operations previously performed on the destination block. An illustrative example of this process is described below with respect to the method 500 of FIG. 5.

In some embodiments, operations 230 and 240 can be performed multiple times prior to proceeding to operation 250. In such instances, processing logic can first determine a number of voltage pulses applied to the applicable wordlines of the destination block. Responsive to determining that the number of voltage pulses applied to the applicable wordlines satisfies or meets a predetermined number, processing logic can apply an additional voltage pulse to the destination block and perform an additional erase operation. In various embodiments, the predetermined number of voltage pulse and erase operations can be associated with the type of memory component of the memory subsystem (e.g., the materials used to manufacture the memory component), the data density of the memory component (e.g., SLC, TLC, MLC, etc.), the heat exposure applied to the memory component during the manufacturing process (e.g., the level of IR Reflow), or the like. For example, if the predetermined number is set to three, processing logic can perform the voltage pulse and erase process three times before proceeding to performing the write operation.

At operation 250, the processing logic performs the write operation to write the data to the destination block that is at the low voltage state. An illustrative example of performing the voltage pulse and erase operations on a memory cell are described below in conjunction with FIGS. 4A-4C.

Figure 3A:
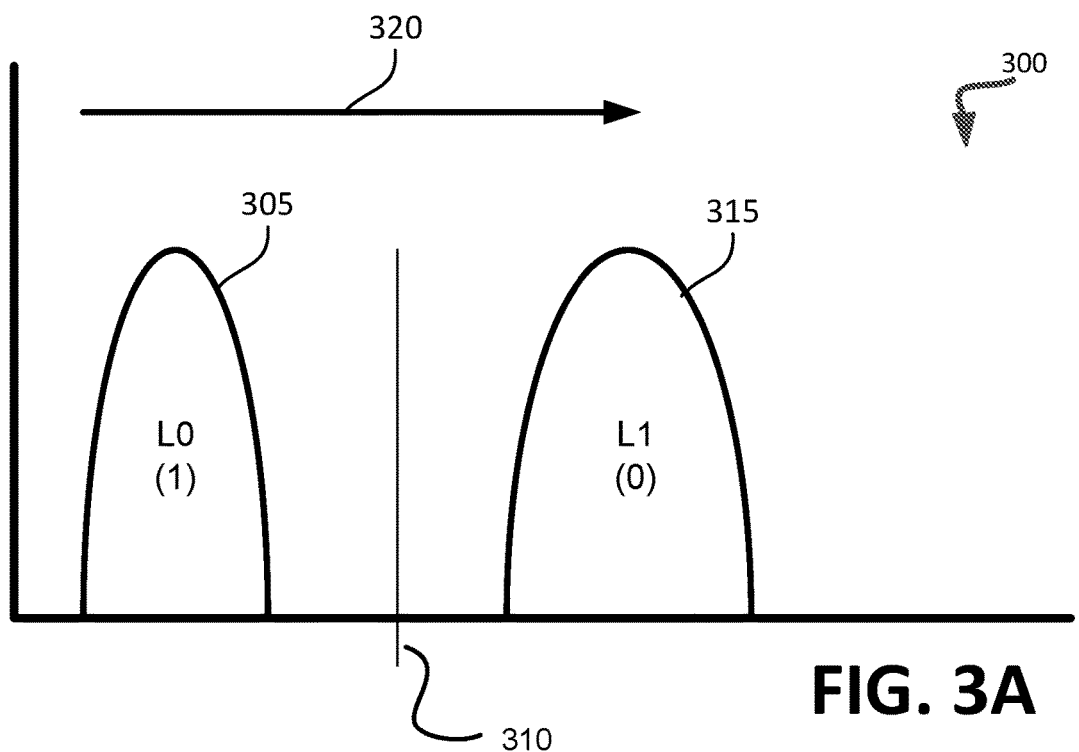
FIG. 3A illustrates an example of the application of a high voltage pulse to a memory cell in accordance with some embodiments of the present disclosure.
Figure 3B:
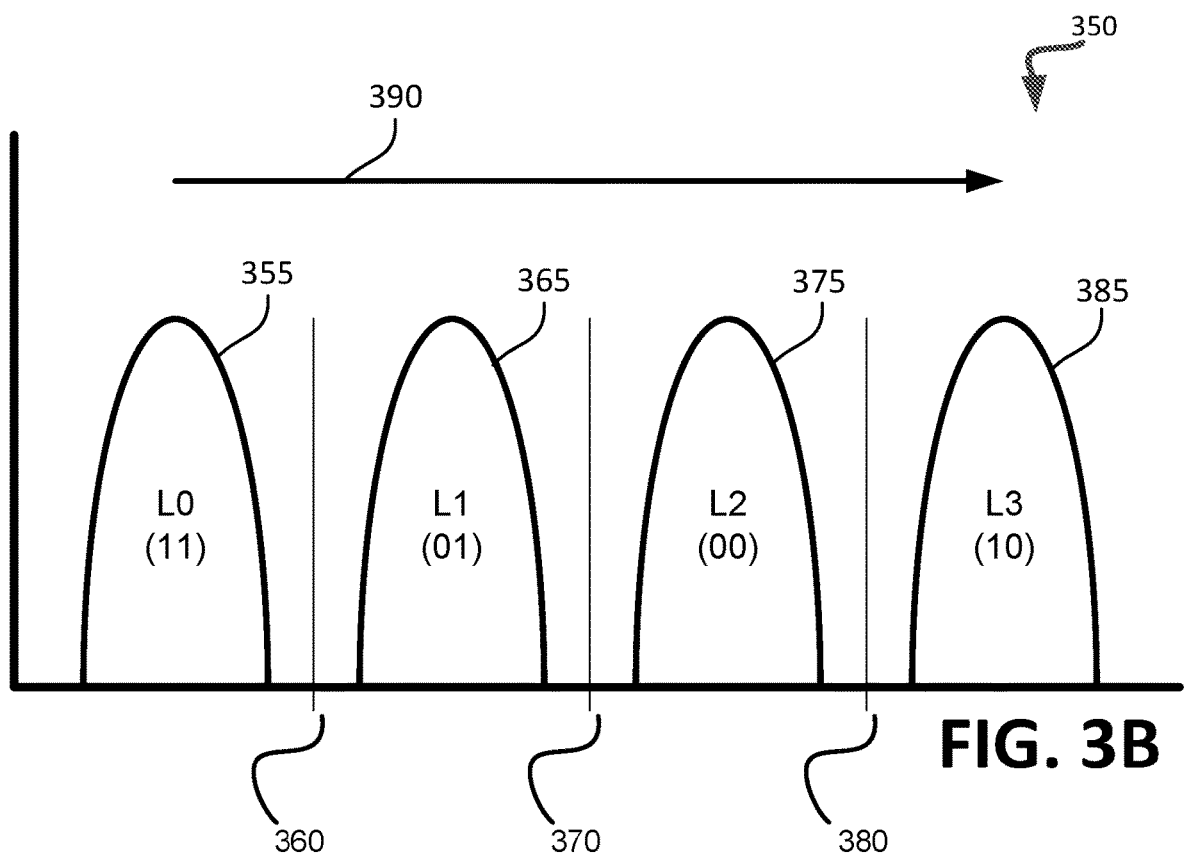
FIG. 3B illustrates another example of the application of a high voltage pulse to a memory cell in accordance with some embodiments of the present disclosure.

FIGS. 3A-3B illustrate the application of a high voltage pulse to memory cells in accordance with some embodiments of the present disclosure. In some embodiments, the application of the high voltage pulse can be performed by the pre-program erase component 113 of FIG. 1 and as described above with respect to FIG. 2 and below with respect to FIG. 5.

As shown in FIG. 3A, a memory cell 300 can store multiple threshold voltage states where each state represents a logical bit value. FIG. 3A illustrates a memory cell that stores voltage states indicative of two logical states. This configuration can be used in an SLC memory cell, which can store a single bit of information in each cell, and therefore each cell can have two possible states—one state L0 representing a value '1' which can be indicative of an erased state and the other state L1 representing a value '0' which can be indicative of a programmed state. For example, a first voltage state 305 can represent the value '1,' and the second voltage state 315 can represent the value '0.' Reference voltage 310 can represent the threshold voltage that can separate bits storing the values at the L0 state (a low voltage state) from those at the L1 state (a high voltage state).

The voltage state 315 can be the voltage state of the memory cell after it has been programmed with data (e.g., after a write has been performed on the memory cell). As described above, the pre-program erase component can apply a high voltage pulse 320 to the memory cell 300 to place the memory cell in the voltage state 315 (e.g., the voltage state associated with the highest voltage level for memory cell 300). The application of the high voltage pulse 320 to the applicable wordline can result in memory cells of the wordline that were at the voltage states 305 to be at the high voltage state 315.

Similarly, as shown in FIG. 3B, a memory cell 350 can store more than two threshold voltage states where each state represents a logical bit value. FIG. 3B illustrates a memory cell that stores voltage states indicative of four logical states. This configuration can be used in an MLC memory cell, which can store multiple bits of information in each cell, and therefore each cell can have multiple possible states—a state L0 representing a value '11' which can be indicative of an erased state, a state L1 representing a value of '01,' a state L2 representing a value '00,' and a state L3 representing a value '10' which can be indicative of a programmed state. For example, a first voltage state 355 can represent the value '11,' the second voltage state 365 can represent the value '01,' the third voltage state can represent the value '00,' and the fourth voltage state can represent the value '10.' Reference voltages 360, 370, and 380 can represent the threshold voltages that can separate bits storing the voltages at the L0 state (a low voltage state) from those at the L1, L2, or L3 state (a high voltage state). It should be noted, that while a particular example of mapping bit values to voltage states has been depicted by FIG. 3B, in some embodiments, other mappings of bit values to voltage states may be used.

The voltage state 385 can be the voltage state of the memory cell after it has been programmed with data (e.g., after a write has been performed on the memory cell). As described above, the pre-program erase component can apply a high voltage pulse 390 to the memory cell 300 to place the memory cell in the voltage state 385 (e.g., the voltage state associated with the highest voltage level for memory cell 350 that is used to represent any particular bit value). The application of the high voltage pulse 390 to the applicable wordline can result in memory cells of the wordline that were at the voltage states 355 (or at voltage states 365 or 375) to be at the high voltage state 385.

Although FIG. 3A illustrates two voltage states representing the combination of two bits and FIG. 3B illustrates four voltage states representing a combination of two bits, any number of voltage states to represent various combinations of bits can be stored at a memory cell. For example, the memory cell of FIGS. 3A-3B can be a multi-level cell (MLC), a triple-level cell (TLC), or a quad-level cell (QLC). The process of applying the high voltage pulse and performing the erase operation in combination is illustrated below with respect to FIGS. 4A-4C.

Figure 4A:
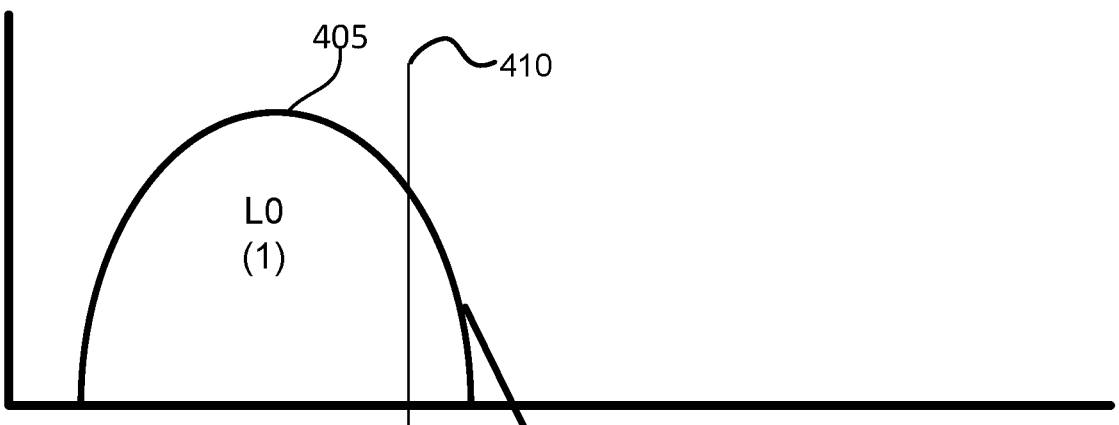
FIGS. 4A-4C illustrate an example of applying a high voltage pulse to wordlines of a block for a memory component combined with a subsequent erase operation in accordance with some embodiments of the present disclosure.
Figure 4B:
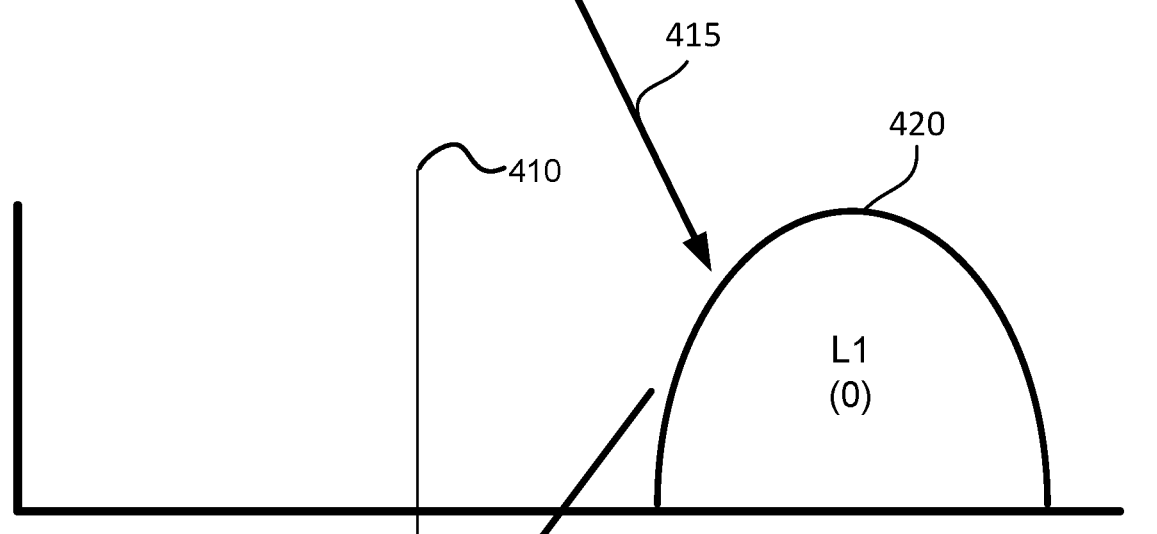
Figure 4C:
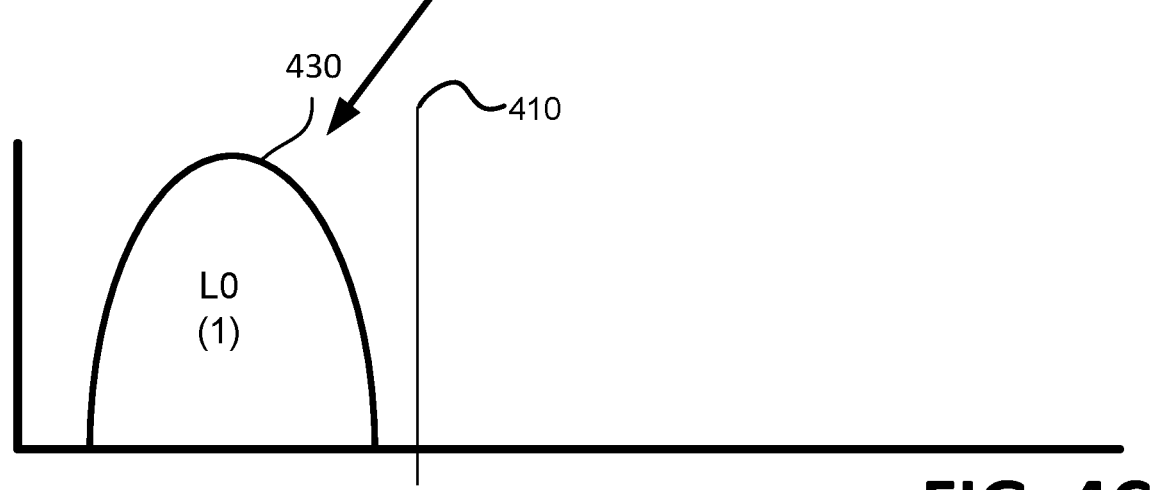

FIGS. 4A-4C illustrate the application of a high voltage pulse to wordlines of a block for a memory component combined with a subsequent erase operation of those wordlines in accordance with some embodiments of the present disclosure. In some embodiments, the application of the high voltage pulse and erase combination can be performed by the pre-program erase component 113 of FIG. 1 and as described above with respect to FIG. 2 and below with respect to FIG. 5.

As shown in FIG. 4A, the wordlines of a block can be at a voltage level associated with a low voltage state 405 (e.g., an erased state). In some instances, the memory cells of the block can be affected by IR reflow, which can cause electron traps or ION contamination. These electron traps and/or ION contamination can cause reliability issues with respect to how a memory cell can retain a particular voltage level. As shown in FIG. 4A, the memory cells of the affected block can be in a low voltage state L0 representing an erased state (e.g., value '1'). However, as a result of electron traps and/or ION contamination, some memory cells, can be at voltage levels that exceed the threshold value 410 that typically separates the low voltage state 405 (e.g., the erased state) from a high voltage state 420 (e.g., the programmed state). Similarly, ION contamination can cause reduced separation between the voltage levels of the low voltage state 405 and high voltage state 420 when subjected to higher temperatures (e.g., data retention temperatures), which can also cause some memory cells to be at voltage levels that exceed the threshold value 410. The phenomenon of "data retention" (also known as "Intrinsic Charge Loss (ICL)") can occur with higher temperatures as compared to lower temperatures. The relation can typically be exponential. In other words, at lower temperatures the effects of ICL are negligible but at higher temperatures, (particularly at temperatures above a threshold) the effects can become dominant enough to cause decreased reliability. After receiving a request to write to this destination block, the pre-program erase component as described herein can apply the high voltage pulse 415 to place the memory cells of the destination block at a voltage level associated with high voltage state 420.

As shown in FIG. 4B, the memory cells of the destination block have been placed at a voltage level associated with the high voltage state 420 (value '0') in response to the application of high voltage pulse 415. The pre-program erase component can then perform an erase operation 425 on the wordlines of the destination block to change the voltage level from the high voltage state 420 to the low voltage state 430 illustrated in FIG. 4C. As shown, the process of applying the high voltage pulse 415, followed by performing the erase operation 425 can place the memory cells at a voltage level that is within the threshold voltage 410. As described above, the voltage pulse and erase operation process may be performed multiple times prior to performing a write operation to the destination block. Additionally, described further below, this process may be performed based on a number of erase operations previously performed on the destination block. Thus, while the number of erase operations is below a threshold, the pre-program erase component can perform the voltage pulse and erase combination until that threshold is reached.

Figure 5:
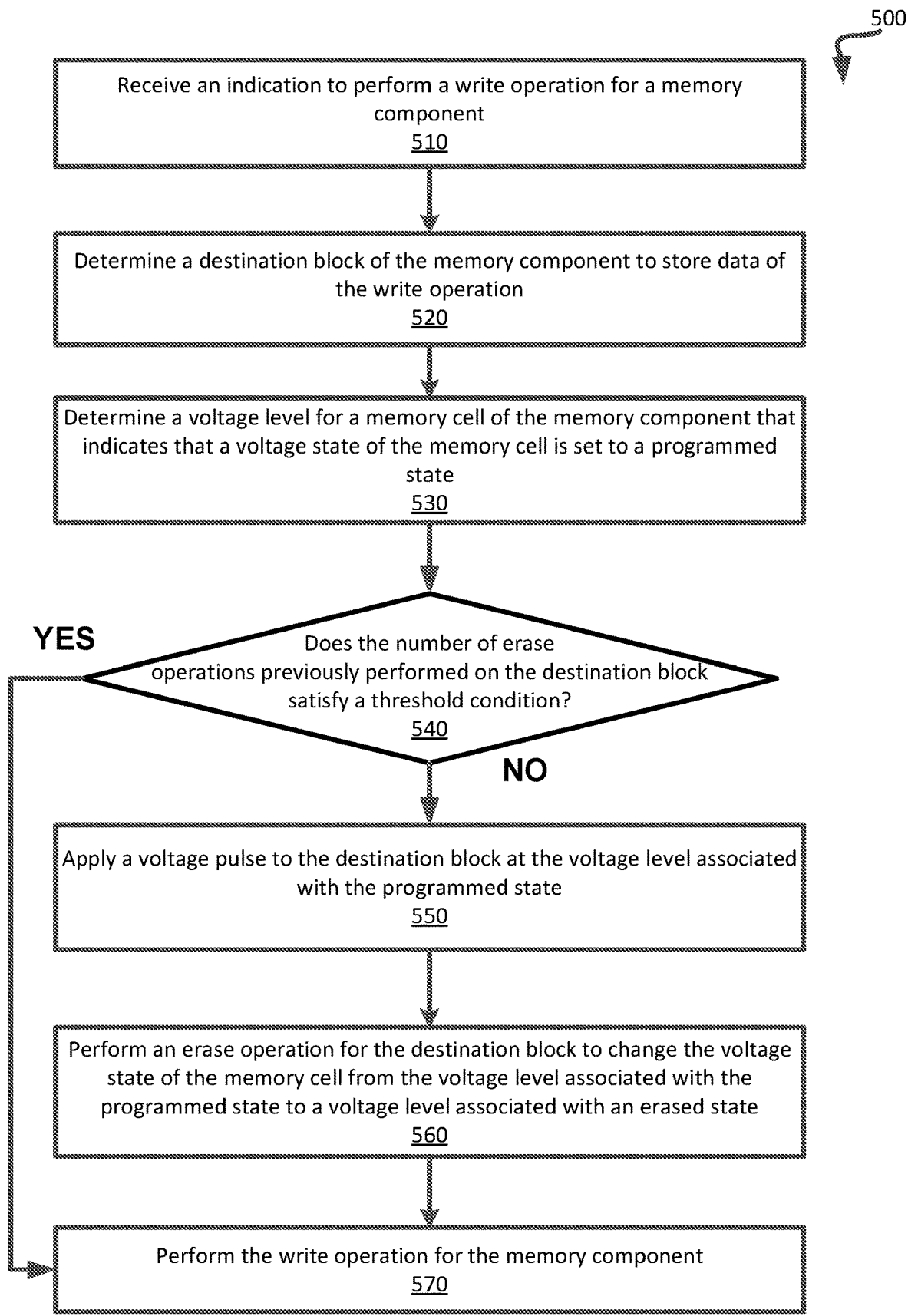
FIG. 5 is a flow diagram of an example method to apply a high voltage pulse to a memory cell prior to an erase operation based on satisfying a threshold condition for a memory sub-system in accordance with some embodiments.

FIG. 5 is a flow diagram of an example method 500 to apply a high voltage pulse to a memory cell prior to an erase operation based on satisfying a threshold condition in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the pre-program erase component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing logic receives an indication to perform a write operation for a memory sub-system. In some embodiments, the indication can be a notification of a request received from a host system to write host data to a memory component of a memory sub-system. Alternatively, the indication can be a notification that data stored on one component of the memory sub-system should be relocated to another component of the memory subsystem (e.g., as a result of a rewrite operation, a garbage collection operation, or other similar operation).

At operation 520, the processing logic determines a destination block of the memory sub-system to store data of the write operation. In some embodiments, the indication received at operation 510 can include an amount of data that is to be written to multiple blocks of the memory component. For example, the data to be written may be divided among multiple destination pages that are located within various blocks of the memory component. The processing logic can determine an available block of the memory component (e.g., a block that is empty and/or otherwise available to receive new data) and divide the data from the request into segments that can be written to one or more pages of the block.

At operation 530, the processing logic determines a voltage level for a memory cell of the memory sub-system that indicates that a voltage state of the memory cell is set to a programmed state. As described above, blocks may be configured with memory cells of varying densities, and thus can store different numbers of bits per cell based on the densities. For example, a block configured as SLC memory cells may store a single bit per cell, and therefore can have two possible voltage states. Similarly, a block configured as MLC memory cells can store multiple bits per cell, and therefore can have multiple possible voltage states. Thus, processing logic can determine, in view of the density of the memory cells of the destination block, the applicable voltage level that indicates that a memory cell of that block is set to the high voltage state (e.g., the programmed state represented by the highest voltage level for the memory cell).

At operation 540, the processing logic determines whether a number of erase operations previously performed on the destination block satisfies a threshold condition. In various embodiments, the total number of erase operations performed on each block of the memory sub-system can be stored in an area of memory separate from the blocks themselves. Each time a write operation is to be performed on any particular block, the number of erase operations for that block can be accessed to determine whether or not to apply the voltage pulse and erase operation cycle to that block. Each performance of the voltage pulse and erase operation cycle can increment the stored number of erase operations as described in further detail below.

If the number of erase operations does not satisfy the threshold (e.g., if the number is beneath a threshold number), processing continues to operation 550. Otherwise, if the number satisfies the threshold (e.g., if the number of erase operations meets or exceeds the threshold number), processing proceeds to operation 570, skipping the voltage pulse and erase process. In various embodiments, the threshold number of erase operations can be associated with the type of memory component of the memory subsystem (e.g., the materials used to manufacture the memory component), the data density of the memory component (e.g., SLC, TLC, MLC, etc.), the heat exposure applied to the memory component during the manufacturing process (e.g., the level of IR Reflow), or the like. In some embodiments, the threshold number can be configured prior to deployment. Alternatively, processing logic can receive the threshold number from a host system or other connected system based on the known attributes of the memory component. In some implementations, the threshold number can be initially set to one number and modified over time based on observed environmental factors (e.g., any residual electron traps or ION contamination that may be present based on observed changes in voltage levels of the memory component).

At operation 550, the processing logic applies a voltage pulse to the destination block at the first voltage level associated with the programmed state. In various embodiments, the voltage pulse is at the voltage level determined operation 530. In some embodiments, the high voltage pulse can be applied to each wordline of the destination block. Alternatively, the high voltage pulse can be applied to a single wordline of the destination block. Similarly, the high voltage pulse can be applied to some number of wordlines that is less than the total number of wordlines of the destination block. As noted above, each memory cell of the one or more wordlines of the destination block to which the high voltage pulse has been applied can thus be in the programmed state in response to the application of the voltage pulse.

At operation 560, the processing logic performs an erase operation for the destination block to change the voltage state of the memory cell from the first voltage level associated with the programmed state to a second voltage level associated with an erased state. In some embodiments, processing logic determines a voltage level that can be applied to the memory cell of the memory component to set the voltage state of the memory cell to indicate that the memory cell is in the erased state. In such cases, the voltage level that determined by operation 530 (the voltage level that indicates that the voltage state is set to a programmed state) exceeds the voltage level to set the voltage state to indicate that the memory cell is in an erased state. Thus, the memory cells for the wordlines of the destination block can be in the erased state in response to performing the erase operation.

In some embodiments, operations 550 and 560 can be performed multiple times prior to proceeding to operation 570. In such instances, processing logic can first determine a number of voltage pulses applied to the applicable wordlines of the destination block. Responsive to determining that the number of voltage pulses applied to the applicable wordlines is below a predetermined number, processing logic can apply an additional voltage pulse to the destination block and perform an additional erase operation. In various embodiments, the predetermined number of voltage pulse and erase operations can be associated with the type of memory component of the memory subsystem. For example, if the predetermined number is set to three, processing logic can perform the voltage pulse and erase process three times before proceeding to performing the write operation.

In some embodiments, processing logic can additionally increment the stored number of erase operations (e.g., the number used by operation 540 to determine whether or not to execute operations 550 and 560) by the number of voltage pulses applied to the wordlines of the destination block. In such cases, processing logic can increment the number each time operations 550 and 560 are performed. Alternatively, processing logic can increment the stored number of erase operations by a function of the number of voltage pulses applied to the wordlines of the destination block. In such cases, the number of erase operations can be incremented by a variable value for each time operations 550 and 560 are performed. The function applied to the number of voltage pulses can be associated with the strength of the pulse applied, the type of materials used in the manufacture of the memory component, factors associated with the manufacturing process (e.g., temperature of the heat applied to the memory component, total time that the heat was applied to the memory component, etc.) or other similar information.

For example, in embodiments where the amplitude of the voltage pulse applied at operation 550 is at the upper end of the high voltage range for the memory component (e.g., at a higher voltage level than the threshold voltage that separates the low voltage state from the high voltage state), the function can be a weight factor that is applied to the number of voltage pulses such that the application of each voltage pulse can increment the stored number of erase operations by a number greater than one. Thus, the pulse/erase cycle can be performed fewer times overall since the higher amplitude pulse can have greater impact on the memory component each time the pulse is applied. Similarly, in embodiments where the amplitude of the voltage pulse applied at operation 550 is at the lower end of the high voltage range (e.g., at a voltage level closer to the threshold voltage that separates the low voltage state from the high voltage state), the function can be a weight factor that is applied to the number of voltage pulses such that the application of each voltage pulse can increment the stored number of erase operations by a number less than one. Thus, the pulse/erase cycle can be performed more times overall since the lower amplitude pulse can have a lesser impact on the memory component each time it is applied.

In an illustrative example, the threshold number of erase operations used by operation 540 to drive the process can be set to 10 based on the temperature used to manufacture the memory component and the amount of time the component was exposed to that temperature. Additionally, the process can be configured to perform the voltage pulse and erase cycle a minimum of three times (the predetermined number of voltage pulse and erase cycles noted above) each time a write operation is performed on a particular block of the memory component. When a write operation is received, operation 530 can determine a voltage level to be used to set the memory cells of a destination block to the high voltage state, and based on the known manufacturing factors listed above, select the voltage level at the upper end of the high voltage range to account for the effects of high temperatures used during the manufacturing process. Additionally, based on the determined voltage level, the function used to increment the number of performed erase operations can be adjusted accordingly.

The first time a write operation is performed on a destination block, the number of erase operations performed on that block may be zero. Operation 540 can detect that this is beneath the threshold of 10, and thus perform the combination of operations 550 and 560 three times (since the predetermined number is set to three) before performing the write operation. Each time operations 550 and 560 are performed (or, alternatively, after operations 550 and 560 are performed the predetermined number of times), the stored number of erase operations performed on the destination block can be updated to be used by operation 540 for subsequent writes to that destination block. If the function applied to each cycle is set to 1.5 based on the voltage level determined at operation 530, the number of erase operations performed on the destination block can be incremented by 1.5 for each execution of the combination of operations 550 and 560. Thus, if the combination is executed three times, the total number of erase operations performed on the destination block at the conclusion of the cycle can be set to 4.5.

When a subsequent write operation directed to that same destination block, operation 540 can determine that 4.5 is less than the threshold of 10, therefore the process can be performed again prior to executing the subsequent write operation. Following the example described above, at the conclusion of the voltage pulse and erase process provoked by the subsequent write operation, the number of erase operations performed on the destination block can be set to 9. This process can continue until the number of erase operations performed on the destination block is greater than 10 (the threshold number). When the next write operation directed to that block is received, operation 540 can determine that the number of previously executed erase operations satisfies the threshold condition, (e.g., is greater than the threshold of 10) and thus bypass the voltage pulse and erase operation combination, and proceed directly to operation 570 to perform the write operation.

At operation 570, the processing logic performs the write operation for the memory sub-system. In some embodiments, the processing logic can perform the write operation to write the data to the wordlines of the destination block that are at the low voltage state.

Figure 6:
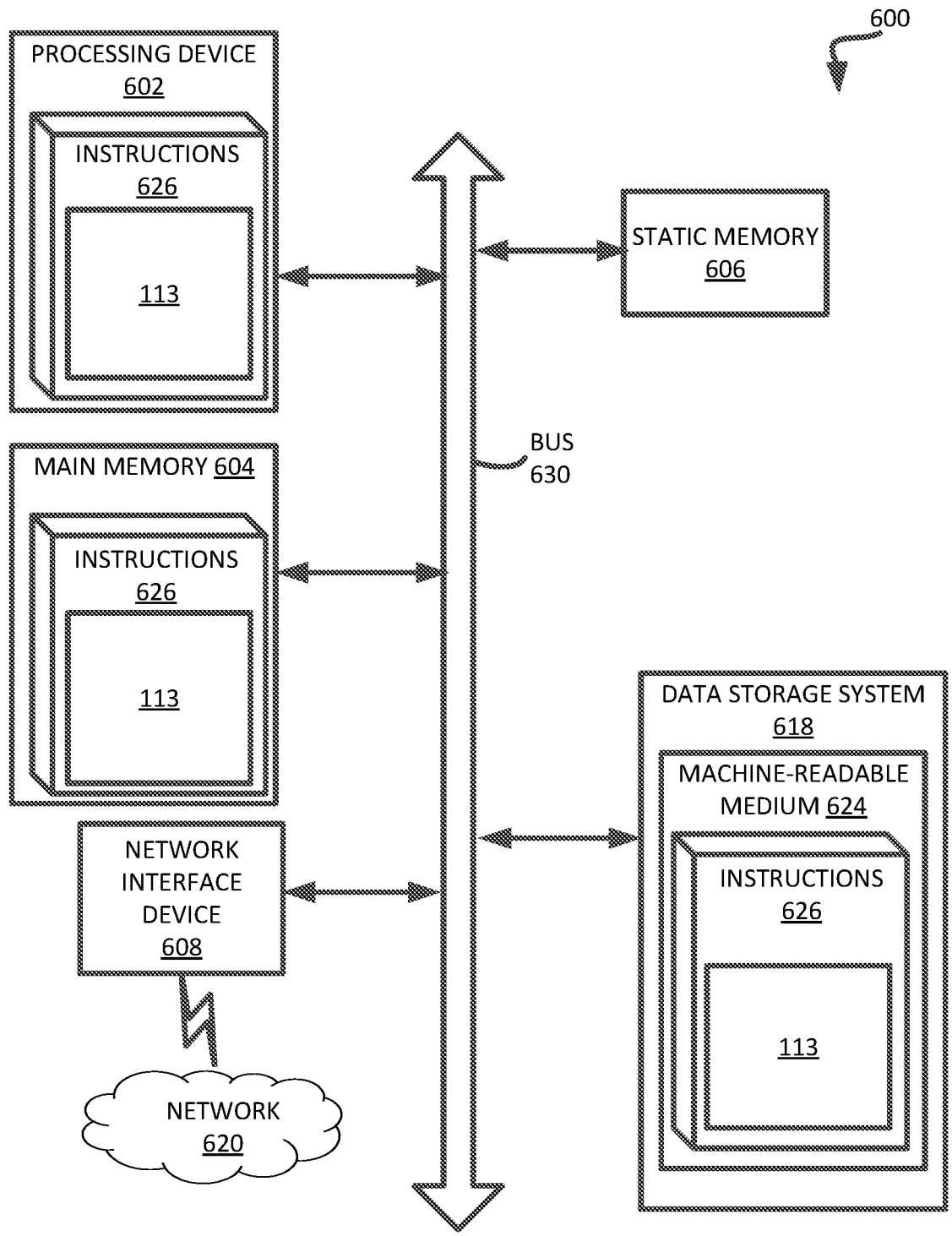
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to pre-program erase component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 508 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a pre-program erase component (e.g., the pre-program erase component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method comprising:
receiving an indication to perform a write operation for the memory component;

applying a voltage pulse to a destination block of the memory component to store data of the write operation, the voltage pulse being at a first voltage level associated with a programmed state;

performing an erase operation for the destination block to change the voltage state of the memory cell from the programmed state to a second voltage level associated with an erased state;

determining whether a number of voltage pulses applied to the destination block satisfies an operation repeat condition;

responsive to determining that the number of voltage pulses applied to the destination block satisfies an operation repeat condition:
  applying an additional voltage pulse to the destination block, the additional voltage pulse being at the first voltage level associated with the programmed state, and
  performing an additional erase operation for the destination block upon applying the additional voltage pulse; and performing the write operation for the memory component.

2. The method of claim 1, wherein a respective memory cell of a wordline of the destination block is in the programmed state in response to the application of the voltage pulse.

3. The method of claim 1, wherein further comprising:
  determining the second voltage level applied to the memory cell of the memory component to set the voltage state of the memory cell to indicate that the memory cell is in the erased state, wherein the first voltage level exceeds the second voltage level, wherein a respective memory cell of a wordline of the destination block is in the erased state in response to performing the erase operation.

4. The method of claim 1, wherein the operation repeat condition corresponds to the number of voltage pulses not satisfying a threshold number of voltage pulses.

5. The method of claim 1, further comprising:
  incrementing the number of erase operations by the number of voltage pulses applied to the destination block.

6. The method of claim 1, further comprising:
  incrementing the number of erase operations by a function of the number of voltage pulses applied to the destination block.

7. The method of claim 1, wherein the voltage pulse is applied to the destination block responsive to determining that a number of erase operations previously performed on the destination block does not satisfy a threshold condition.

8. A system comprising:
  a memory component; and
  a processing device, operatively coupled with the memory component, to perform operations comprising:
    receiving an indication to perform a write operation for the memory component;
    applying a voltage pulse to a destination block of the memory component to store data of the write operation, the voltage pulse being at a first voltage level associated with a programmed state;
    performing an erase operation for the destination block to change the voltage state of the memory cell from the programmed state to a second voltage level associated with an erased state;
    determining whether a number of voltage pulses applied to the destination block satisfies an operation repeat condition;
    responsive to determining that the number of voltage pulses applied to the destination block satisfies an operation repeat condition:
      applying an additional voltage pulse to the destination block, the additional voltage pulse being at the first voltage level associated with the programmed state, and
      performing an additional erase operation for the destination block upon applying the additional voltage pulse; and
    performing the write operation for the memory component.

9. The system of claim 8, wherein a respective memory cell of a wordline of the destination block is in the programmed state in response to the application of the voltage pulse.

10. The system of claim 8, wherein the operations further comprise:
  determining the second voltage level applied to the memory cell of the memory component to set the voltage state of the memory cell to indicate that the memory cell is in the erased state, wherein the first voltage level exceeds the second voltage level, wherein a respective memory cell of a wordline of the destination block is in the erased state in response to performing the erase operation.

11. The system of claim 8, wherein the operations further comprise:
  determining the number of voltage pulses applied to the destination block.

12. The system of claim 8, wherein the operation repeat condition corresponds to the number of voltage pulses not satisfying a threshold number of voltage pulses.

13. The system of claim 8, wherein the operations further comprise:
  incrementing the number of erase operations by the number of voltage pulses applied to the destination block.

14. The system of claim 8, wherein the operations further comprise:
  incrementing the number of erase operations by a function of the number of voltage pulses applied to the destination block.

15. The system of claim 8, wherein the voltage pulse is applied to the destination block responsive to determining that a number of erase operations previously performed on the destination block does not satisfy a threshold condition.

16. A non-transitory computer readable medium comprising instructions, which when executed by a processing device, cause the processing device to perform operations comprising:
  receiving an indication to perform a write operation for the memory component;
  applying a voltage pulse to a destination block of the memory component to store data of the write operation, the voltage pulse being at a first voltage level associated with a programmed state;
  performing an erase operation for the destination block to change the voltage state of the memory cell from the programmed state to a second voltage level associated with an erased state;
  determining whether a number of voltage pulses applied to the destination block satisfies an operation repeat condition;

responsive to determining that the number of voltage pulses applied to the destination block satisfies an operation repeat condition:
applying an additional voltage pulse to the destination block, the additional voltage pulse being at the first voltage level associated with the programmed state, and
performing an additional erase operation for the destination block upon applying the additional voltage pulse; and
performing the write operation for the memory component.

17. The non-transitory computer readable medium of claim 16, wherein a respective memory cell of a wordline of the destination block is in the programmed state in response to the application of the voltage pulse.

18. The non-transitory computer readable medium of claim 16, wherein the operations further comprise:
determining the second voltage level applied to the memory cell of the memory component to set the voltage state of the memory cell to indicate that the memory cell is in the erased state, wherein the first voltage level exceeds the second voltage level, wherein a respective memory cell of a wordline of the destination block is in the erased state in response to performing the erase operation.

19. The non-transitory computer readable medium of claim 16, wherein the operation repeat condition corresponds to the number of voltage pulses not satisfying a threshold number of voltage pulses.

20. The non-transitory computer readable medium of claim 16, wherein the operations further comprise:
incrementing the number of erase operations by the number of voltage pulses applied to the destination block.

* * * * *